United States Patent [19]

Inoue et al.

[11] Patent Number: 5,727,168
[45] Date of Patent: Mar. 10, 1998

[54] I/O CARD, CABLE CONNECTED TO THE I/O CARD, AND METHOD FOR SAVING POWER OF I/O CARD

[75] Inventors: Akinobu Inoue; Atsuko Yamaguchi; Noriyuki Okajima; Hiroshi Matsuda, all of Kawasaki, Japan

[73] Assignee: Fujitsu Limited, Kawasaki, Japan

[21] Appl. No.: 466,734

[22] Filed: Jun. 6, 1995

[30] Foreign Application Priority Data

Sep. 26, 1994 [JP] Japan ................. 6-229793

[51] Int. Cl.[6] .............. G06F 13/00; H05K 7/10; H01R 9/09
[52] U.S. Cl. .......................... 395/282; 395/750
[58] Field of Search ............... 395/282, 283, 395/281, 821, 800, 750, 560; 439/218, 76.1; 361/733; 364/514 R, 707

[56] References Cited

U.S. PATENT DOCUMENTS

| | | | |
|---|---|---|---|
| 4,835,737 | 5/1989 | Herrig et al. | 395/283 |
| 5,163,836 | 11/1992 | Young et al. | 439/67 |
| 5,210,855 | 5/1993 | Bartol | 395/500 |
| 5,241,647 | 8/1993 | Lin et al. | 395/550 |
| 5,242,310 | 9/1993 | Leung | 439/76 |
| 5,247,619 | 9/1993 | Mutoh et al. | 395/283 |
| 5,310,998 | 5/1994 | Okuno | 235/380 |
| 5,406,453 | 4/1995 | Cusato et al. | 361/733 |
| 5,409,385 | 4/1995 | Tan et al. | 439/76 |
| 5,501,608 | 3/1996 | Scheer et al. | 439/218 |
| 5,513,329 | 4/1996 | Pecone | 395/281 |

*Primary Examiner*—Gopal C. Ray
*Attorney, Agent, or Firm*—Nikaido, Marmelstein, Murray & Oram LLP

[57] ABSTRACT

In an I/O card that can be inserted into a slot of an electronic device and supplied with electricity therefrom, a first connector can engage a connector provided in the slot of the electronic device. A second connector can engage an external connector of an interconnection cable used to connect the I/O card to an external device. A circuit notifies the electronic device that the I/O card has been loaded to the slot thereof when the external connector is connected to the second connector of the I/o card inserted into the slot. The I/O card receives a supply of electricity from the electronic device, the supply being started after the electronic device is notified by the circuit.

8 Claims, 5 Drawing Sheets

I/O CARD, CABLE CONNECTED TO THE I/O CARD, AND METHOD FOR SAVING POWER OF I/O CARD

BACKGROUND OF THE INVENTION

1. Field of the Invention

The present invention generally relates to I/O (Input/Output) cards inserted into slots provided in electronic devices, such as note-type personal computers and workstations. More particularly, the present invention is concerned with an I/O card which receives electricity from the electronic device the I/O card is loaded thereto and has a function of interfacing (communicating) with an external device.

Recently, electronic devices have been down-sized and driven by a battery. Under the above situation, it is desired to reduce power consumed in not only the electronic devices but also optional units.

2. Description of the Prior Art

An I/O card is an optional unit for compact electronic devices. Now, various I/O cards loaded to slots provided in electronic devices are manufactured and sold by many companies. Particularly, I/O cards which have a communicating function, such as MODEM, SCSI or LAN I/O cards, have a first connector located on a first side which is inserted into the slot of the electronic device, and a second connector located on a second side opposite to the first side. The second connector of the I/O cards is used to electrically connect the I/O cards to an external electronic device or a communications network.

Such I/O cards are standardized by, for example, JEIDA (Japanese Electronic Industry Development Association) and PCMCIA (Personal Computer Memory Card International Association). According to the standards, the electronic device detects an event in which the I/O card is loaded to the slot of the device, and starts to supply electricity to the I/O card. Then, the electronic device continues to supply the I/O card with electricity while the I/O card is placed in a position.

FIG. 1 is a diagram which shows an I/O card detecting method defined in the PCMCIA PC CARD STANDARD-RELEASE 2.0, the disclosure of which is hereby incorporated by reference. An electronic device 10 includes pull-up resistors R1 and R2 therein. When an I/O card 20 is not loaded to a connector provided in a slot of the electronic device 10, signals A and B, which are output via buffers 11 and 12 to a not-shown internal circuit such as an interface circuit or a CPU, are at a VCC (high) level. The internal circuit of the electronic device 10 detects the above situation, and concludes that the I/O card 10 is not yet loaded. When the I/O card 20 is loaded and placed in a position in the slot, the resistors R1 and R2 are grounded in the I/O card 20. Hence, the output signals A and B of the buffers 11 and 12 are switched to the ground (low) level. Then, an internal power source of the electronic device 10, such as a battery, starts to supply the I/O card 20 with electricity. It will be noted that a connector of the I/O card 20 with which a signal cable is to be connected is not illustrated, for the sake of simplicity.

However, the I/O card detecting method shown in FIG. 1 has the following problem. The electronic device 10 continues to supply electricity to the I/O card 20 as long as the signals A and B are at the ground level. Hence, even when the I/O card 20 is not in use, the electronic device 10 continues to supply the I/O card 20 with electricity as long as the I/O card is maintained in the loaded state. This is wasteful of power.

In order to solve the above problem, it may be considerable to conclude that the I/O card 20 is not in use in a case where no data is transferred within a time period after the I/O card 20 is loaded and to shift the operation to a power-down mode in which a minimum amount of power necessary for the I/O card 20 is supplied thereto. However, even in the power-down mode, electricity is still supplied to the I/O card 20. This means that the power-down mode cannot reduce the power consumption to zero.

SUMMARY OF THE INVENTION

It is a general object of the present invention to completely stop a supply of electricity to an I/O card while the I/O card is not in use so as to reduce power consumed in the I/O card to zero.

This object of the present invention is achieved by an I/O card that can be inserted into a slot of an electronic device and supplied with electricity therefrom, the I/O card comprising: a first connector which can engage a connector provided in the slot of the electronic device; a second connector which can engage an external connector of an interconnection cable used to connect the I/O card to an external device; and a circuit which notifies the electronic device that the I/O card has been loaded to the slot thereof when the external connector is connected to the second connector of the I/O card inserted into the slot. The I/O card receives a supply of electricity from the electronic device, the supply being started after the electronic device is notified by the circuit. According to the above I/O card, electricity is not supplied to the I/O card when the I/O card is merely loaded to the slot of the electronic device. In this case, no power is consumed in the I/O card. The supply of electricity is started when the external connector is attached to the I/O card. When the external connector of the interconnection cable is not attached to the I/O card, i.e., when is not in use, the electronic device with the I/O card loaded thereto can be carried with no power thereto being consumed in the I/O card.

The above object of the present invention is also achieved by an interconnection cable connectable to an I/O card that can be inserted into a slot of an electronic device and supplied with electricity therefrom, the interconnection cable comprising: an external connector connectable to a connector of the I/O card; and a circuit part carrying a detection signal from the I/O card to the electronic device, the detection signal indicating that the I/O card has been loaded to the slot of the electronic device when the external connector is connected to the connector of the I/O card inserted into the slot. The I/O card receives a supply of electricity from the electronic device, and the above supply is started after the electronic device receives the detection signal. The above interconnection cable provides the same advantages as those of the above-mentioned I/O card.

The above object of the present invention is also achieved by a power saving method for an I/O card which is inserted into a slot of an electronic device and supplied with electricity therefrom, the power saving method comprising the steps of: outputting a detection signal notifying the electronic device that the I/O card has been loaded to the slot thereof when an external connector is connected to a connector of the I/O card inserted into the slot,; and starting a supply of electricity from the electronic device to the I/O card in response to receipt of the detection signal. The above power saving method provides the same advantages as those of the above-mentioned I/O card.

The above object of the present invention is also achieved by an I/O card that can be inserted into a slot of an electronic device and supplied with electricity therefrom, the I/O card comprising: a first connector which can engage a connector provided in the slot of the electronic device; a second connector which can engage an external connector of an interconnection cable used to connect the I/O card to an external device; and a circuit which forms a line carrying a clock signal to an internal circuit of the I/O circuit when the external connector is connected to the second connector. According to the above I/O card, the clock signal is not supplied to the internal circuit until the interconnection cable is attached to the I/O card. Hence, power consumed in the I/O card can be substantially reduced to zero in the absence of the clock signal even when electricity is supplied to the I/O card. If the external connector of the interconnection cable is not attached to the I/O card which is not in use, the electronic device with the I/O card loaded thereto can be carried in a state in which no power is consumed in the I/O card.

The above object of the present invention is also achieved by an interconnection cable connectable to an I/O card that can be inserted into a slot of an electronic device and supplied with electricity therefrom, the interconnection cable comprising: an external connector connectable to a connector of the I/O card; and a circuit part carrying a clock signal from the I/O card to an internal circuit of the I/O card. The above cable provides the same advantages as described above.

The above object of the present invention is also achieved by a power saving method for an I/O card that can be inserted into a slot of an electronic device and supplied with electricity therefrom, the power saving method comprising the steps of: connecting an external connector of an interconnection cable to a connector of the I/O card; and carrying a clock signal from the I/O card to an internal circuit of the I/O card via the external connector. The same advantages as described above can be obtained.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
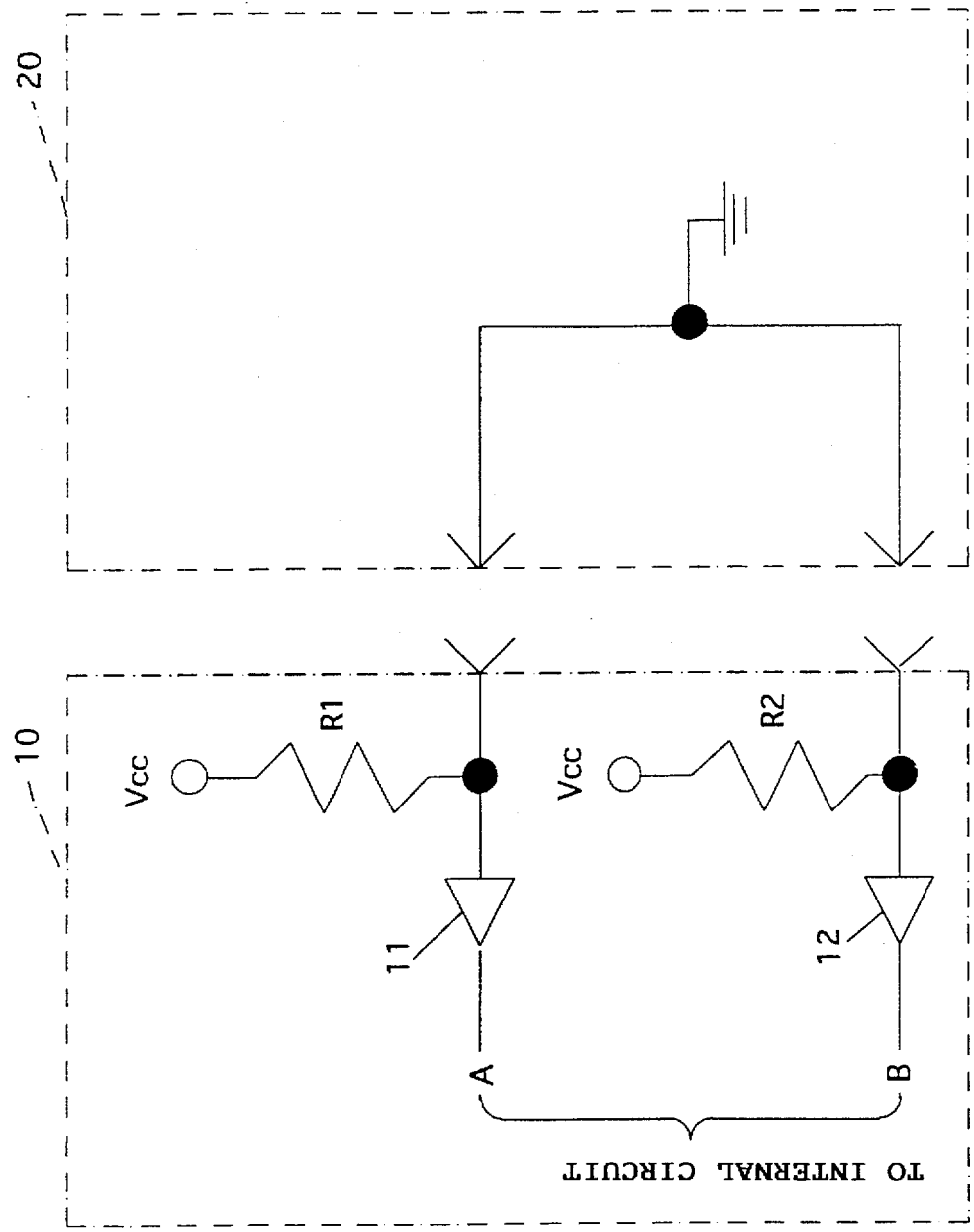
FIG. 1 is a block diagram illustrating a conventional method for determining whether an I/O card has been loaded to an electronic device.
Figure 2:
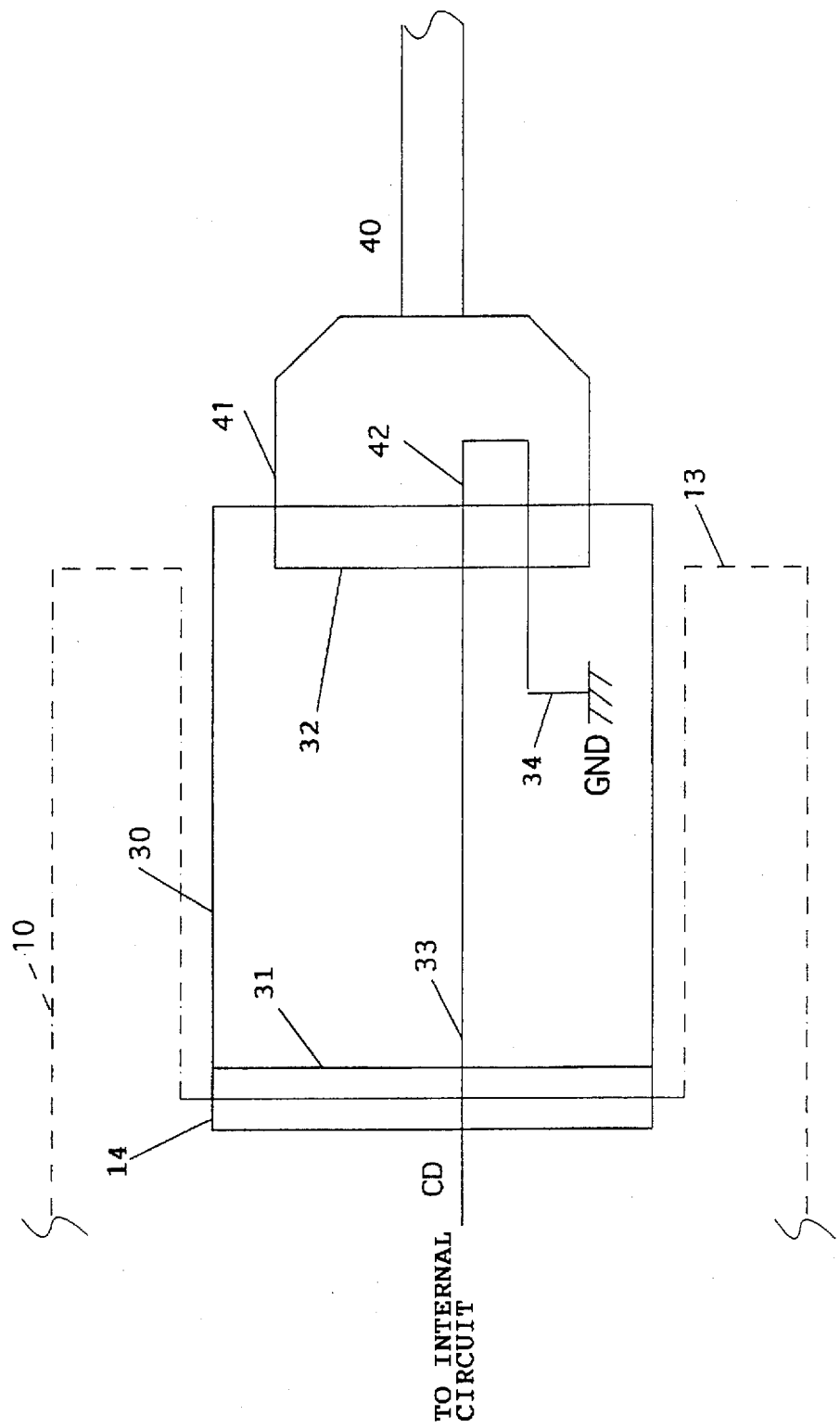
FIG. 2 is a block diagram of the principle of the present invention.

FIG. 2 is a block diagram of the principle of the present invention. More particularly, FIG. 2 schematically depicts a situation in which an I/O card 30 with an interconnection cable 40 connected thereto is loaded to a slot 13 of an electronic device 10 (hereinafter referred to as personal computer 10). The I/O card 30 has a first connector 31, which engages an in-slot connector 14 of the personal computer 10. Also, the I/O card 30 has a second connector 32, which engages an external connector 41 of the interconnection cable 40.

The I/O card 30 has a card loading detection signal line 33 used to make a decision as to whether the I/O card 30 has been loaded. The card loading detection signal line 33 is connected to a not-shown internal circuit (for example, an interface circuit or a CPU) via the first connector 31 and the in-slot connector 14 of the personal computer 10. The internal circuit of the personal computer 10 detects the potential of the card loading detection signal line 33, and determines whether the I/O card 30 has been loaded to the slot 13 of the personal computer 10. In other words, the potential of the card loading detection signal line 33 forms a detection signal CD, which makes the internal circuit determine whether or not the I/O card 30 is in the loaded state. Further, the I/O card 30 has a ground line 34, which grounds the card loading detection signal line 33 when the external connector 41 of the interconnection cable 40 is attached to the second connector 32.

The external connector 41 of the interconnection cable 40 includes an internal interconnection 42, which connects the card loading detection signal line 33 to the ground line 34 when the external connector 41 is connected to the second connector 32 of the I/O card 30.

When the external connector 41 is not attached to the second connector 32 in the state in which the I/O card 30 is in the loaded state, the signal line 33 is open and the detection signal CD is at a predetermined level (for example, a power supply potential VCC). In the above state, the internal circuit of the personal computer 10 determines that no I/O card has been loaded although the I/O card 30 is in the loaded state, and inhibits electricity from a built-in power source in the personal computer 10 from being supplied to the I/O card 30.

When the external connector 41 is attached to the second connector 32 of the I/O card 30, the detection signal CD transmitted over the card loading detection signal line 33 is at the ground level. Hence, the internal circuit in the personal computer 10 determines that the I/O card 30 has been loaded to the slot 13. Then, the internal circuit allows the built-in power source to supply electricity to the I/O card 30 via the in-slot connector 14 and the first connector 31. The built-in power source continues to supply electricity to the I/O card 30 as long as the detection signal CD is at the ground level, in other words, the external connector 41 is attached to the second connector 32 of the I/O card 30.

Hence, if the external connector 41 is not attached to the second connector 32 of the I/O card 30, no electricity is supplied to the I/O card 30 even when the I/O card 30 has been loaded to the slot 13. In this case, electricity is not consumed in the I/O card 30 at all. The above effect is very advantageous in a case where the personal computer 10 is driven by a buffer (which corresponds to the above-mentioned built-in power source).

Figure 3:
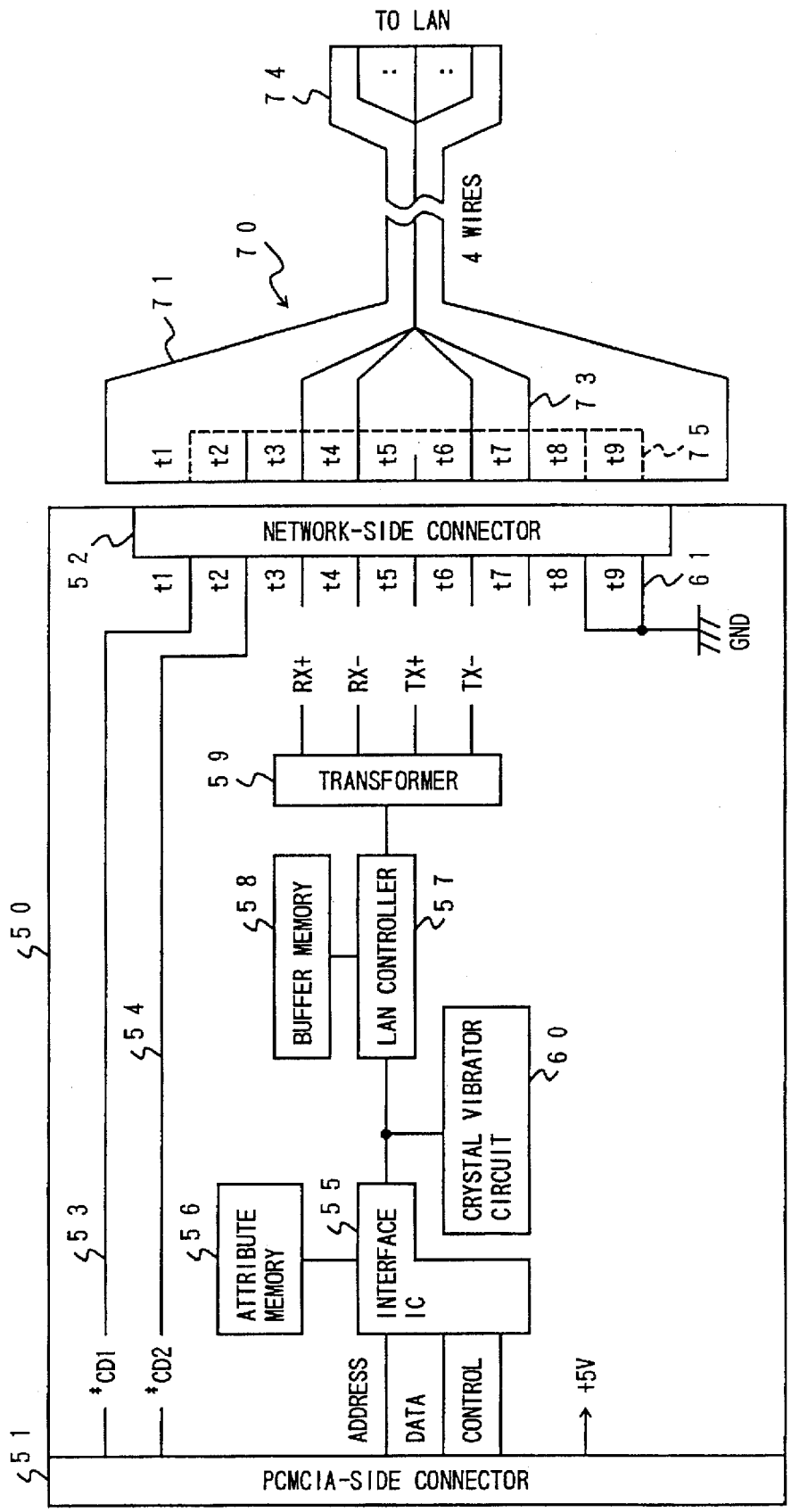
FIG. 3 is a block diagram of a first embodiment of the present invention.

FIG. 3 is a block diagram of an I/O card and an interconnection cable (also referred to as a communications cable) according to a first embodiment of the present invention.

An I/O card 50 is a card used to connect electronic devices such as a personal computer to a network such as a LAN (Local Area Network). In this regard, such an I/O card is also referred to as a LAN card. The I/O card 50 has a PCMCIA-side connector 51, which corresponds to the aforementioned first connector, and a network-side connector 52, which corresponds to the aforementioned second connector. The PCMCIA-side connector 51 is a connector which conforms with the PCMCIA standard, and is hereinafter referred to as a main-body-side connector. The main-body-side connector 51 has terminals to which two card loading detection signal lines 53, an address bus, a data bus, a control line and a power supply line (+5V) are connected. The card loading detection signal lines 53 conform with the aforementioned PCMCIA PC CARD STANDARD-RELEASE 2.0, and respectively carry detection signals *CD 1 and *CD2. These detection signals are active-low signals, which are switched to a low level when the loading of the I/O card 50 is detected.

The network-side connector 52 includes a nine-pin (terminal) structure, which has t1 through t9. The two card loading detection signal lines 53 are respectively connected to the terminals t1 and t2. The terminals t8 and t9 are grounded. The terminal t5 is a spare terminal. The other terminals will be described later.

Further, the I/O card 50 includes an interface IC (Integrated Circuit) 55, an attribute memory 56, a LAN controller 57, a buffer memory 58, a transformer 59 and a crystal vibrator circuit 60. The interface IC 55 forms an interface between the main-body side and the network side, and is connected to the above-mentioned address bus, the data bus, the control line, the attribute memory 56, and the LAN controller 57. The attribute memory 56 stores given attribute information concerning the interface (for example, information concerning the bit rate and format used at the network side). The attribute information can be read from the memory 56 under the control of the interface IC 55. The LAN controller 59 sends data to a LAN (not shown for the sake of simplicity) to which the I/O card 50 is connected, and controls an operation on receipt of data from the LAN. The buffer memory 57 temporarily stores data to be sent to the LAN and data received therefrom. The transformer 59 forms an interface between two wires connected to the LAN controller 57 and four wires provided on the network side. The above four wires consists of two wires $RX_+$ and $Rx_-$ on the receive side, and two wires $TX_+$ and $TX_-$ on the transmit side. The two receive-side wires $RX_+$ and $RX_-$ are respectively connected to the terminals t3 and t4 of the network-side connector 52. The two transmit-side wires $TX_+$ and $TX_-$ are respectively connected to the terminals t6 and t7 of the network-side connector 52. The crystal vibrator circuit 60 sends timing information (a clock signal) to the interface IC 55 and the LAN controller 57.

FIG. 3 also shows a communications (interconnection) cable 70. An external connector 71 is connected to one end of the communications cable 70, and a network connector 74 which may be connected to a connector of the LAN is connected to the other end of the communications cable 70. The external connector 71 has a nine-terminal structure like the main-body-side connector 51, and has nine terminals t1 through t9. The terminals t1, t2, t8 and t9 of the external connector 71 are connected together via an internal connection line 72, and are connectable to the terminals t1, t2, t8 and t9 of the network-side connector 52 of the I/O card 50. The terminals t3, t4, t6 and t7 of the external connector 71 are respectively connectable to the signal lines $RX_+$, $RX_-$, $TX_+$ and $TX_-$ via the terminals t3, t4, t6 and t7 of the network-side connector 52.

Figure 4:
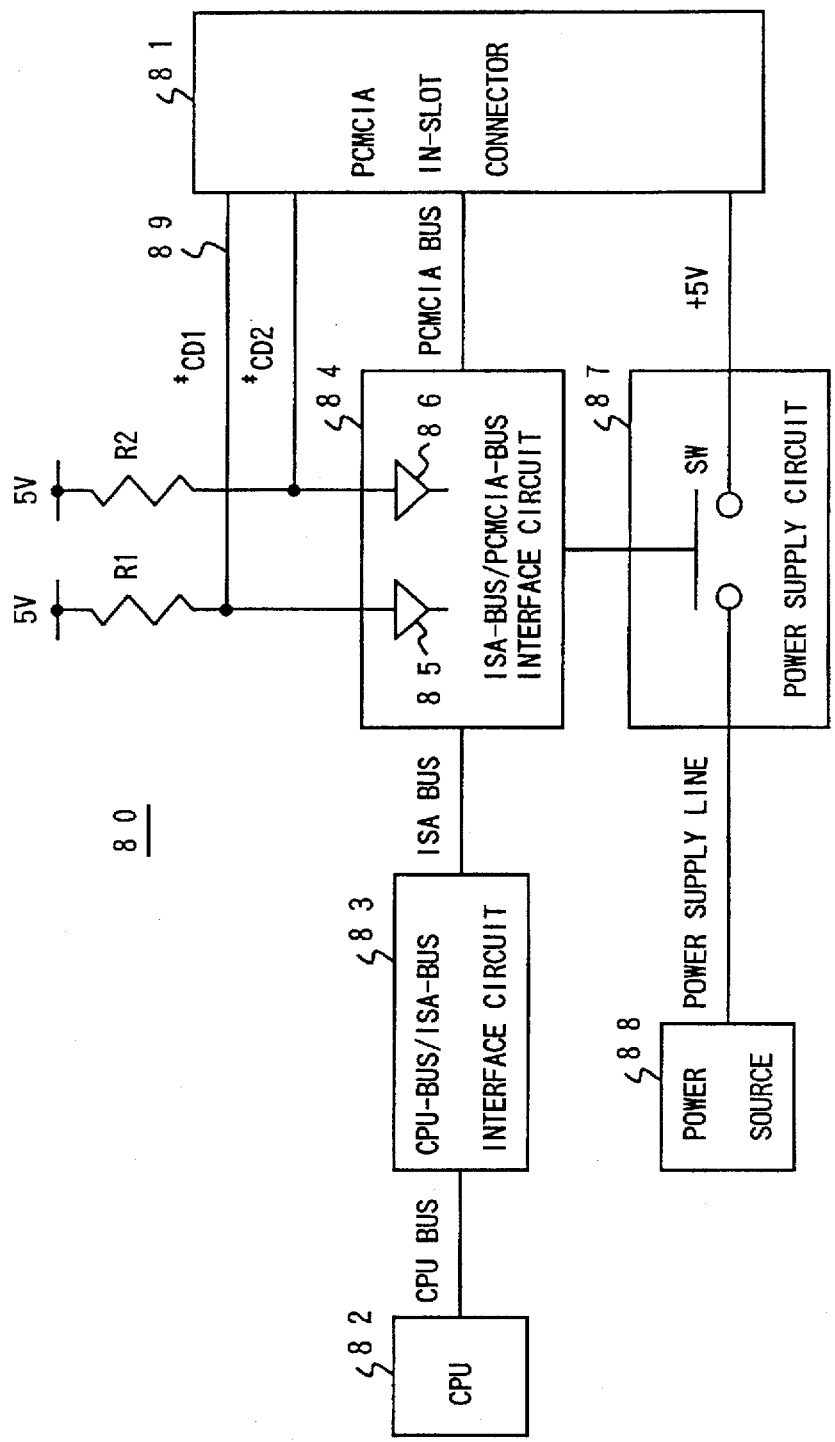
FIG. 4 is a block diagram of a part of an electronic device such as a personal computer.

FIG. 4 is a block diagram of a part of an electronic device to which the I/O card 50 can be loaded. The electronic device shown in FIG. 4 is a personal computer 80, which has a PCMCIA in-slot connector 81 (which is hereinafter referred to as in-slot connector 81). The in-slot connector 81 can be connected to the main-body-side connector 51 of the I/O card 50, and has terminals corresponding to the terminals of the main-body-side connector 51. The personal computer 80 has a CPU 82, a CPU-bus/ISA-bus interface circuit 83, an ISA-bus/PCMCIA-bus interface circuit 84, a power supply circuit 87 and a power source 88.

The CPU 82 controls the operation of the overall personal computer 80. The CPU-bus/ISA-bus interface circuit 83 is connected to the CPU 82 via a CPU bus, and the ISA-bus/PCMCIA-bus interface circuit 84 via an ISA bus, and forms an interface between these buses. The ISA-bus/PCMCIA-bus interface circuit 84 is connected to the ISA bus and an PCMCIA bus, and forms an interface between these buses. The PCMCIA bus includes the aforementioned address bus, the data bus and the control line shown in FIG. 3.

The ISA-bus/PCMCIA-bus interface circuit 84 includes buffers 85 and 86, which are respectively coupled to the power supply line (+5V) via resistors R1 and R2 and are also connected to the card loading detection signal lines 89. As is known, the interface circuit 84 detects the levels of the card loading detection signal lines 89 (detection signals *CD1 and *CD2), and controls a switch SW in the power supply circuit 87 on the basis of the detection result. More particularly, when the detection signals *CD1 and *CD2 are at the high level (equal to +5V), the interface circuit 84 maintains the switch SW in the open state (OFF). When the detection signals *CD1 and *CD2 are at the low level (ground level), the interface circuit 84 maintains the switch SW in the closed state (ON). When the switch SW is in the closed state, the power supply voltage of +5V from the power source 88 is applied to the corresponding terminal of the in-slot connector 81. The power supply circuit 88 has a circuit which generates a DC voltage from a commercial power source or a battery (these parts are well-known and are thus not shown for the sake of simplicity). The electricity provided by the power supply circuit is derived from either the commercial power source or the battery.

A description will now be given of the first embodiment of the present invention. When the I/O card 50 is inserted into the slot of the personal computer 80, the main-body-side connector 51 of the I/O card 50 engages the in-slot connector 81, and the corresponding signal lines are connected together. For example, the card loading detection signal lines 53 in the I/O card 50 are connected to the card loading detection signal lines 89 in the personal computer 80. In this state, if the external connector 71 is not connected to the network-side connector 52 of the I/O card 50, the card loading detection signal lines 53 in the I/O card 50 are in the open state, and the detection signals *CD1 and *CD2 are at the high level. Hence, the switch SW of the power supply circuit 87 is OFF under the control of the interface circuit 84, and electricity is not supplied to the I/O card 50 at all. It will be noted that, in the prior art, some electricity is supplied to the I/O card when it is in the loaded state.

When the external connector 71 of the communications cable 70 is attached to the network-side connector 52 of the I/O card 50 which has been loaded to the personal computer 80, the card loading detection signal lines 53 in the I/O card 50 are connected to the ground line 61 in the I/O card 50 via the internal connection line 72 of the external connector 71. Hence, the detection signals *CD1 and *CD2 are switched to the ground level. The above level change is detected by the detection circuit 84, which turns ON the switch SW of the power supply circuit 87. Hence, electricity from the power source 88 is supplied to the I/O card 50 via the switch SW and the in-slot connector 81. As a result, the I/O card 50 is switched to the operable state.

As described above, even when the I/O card 50 has been loaded to the personal computer 80, no power is consumed in the I/O card 50 as long as the external connector 71 is not connected to the I/O card 50. Hence, when the user does not want to use the I/O card 50, no power is consumed when the communications cable 70 is detached from the I/O card 50. Hence, it is possible to carry the personal computer 80 with the I/O card 50 loaded thereto without power consumption.

Figure 5:
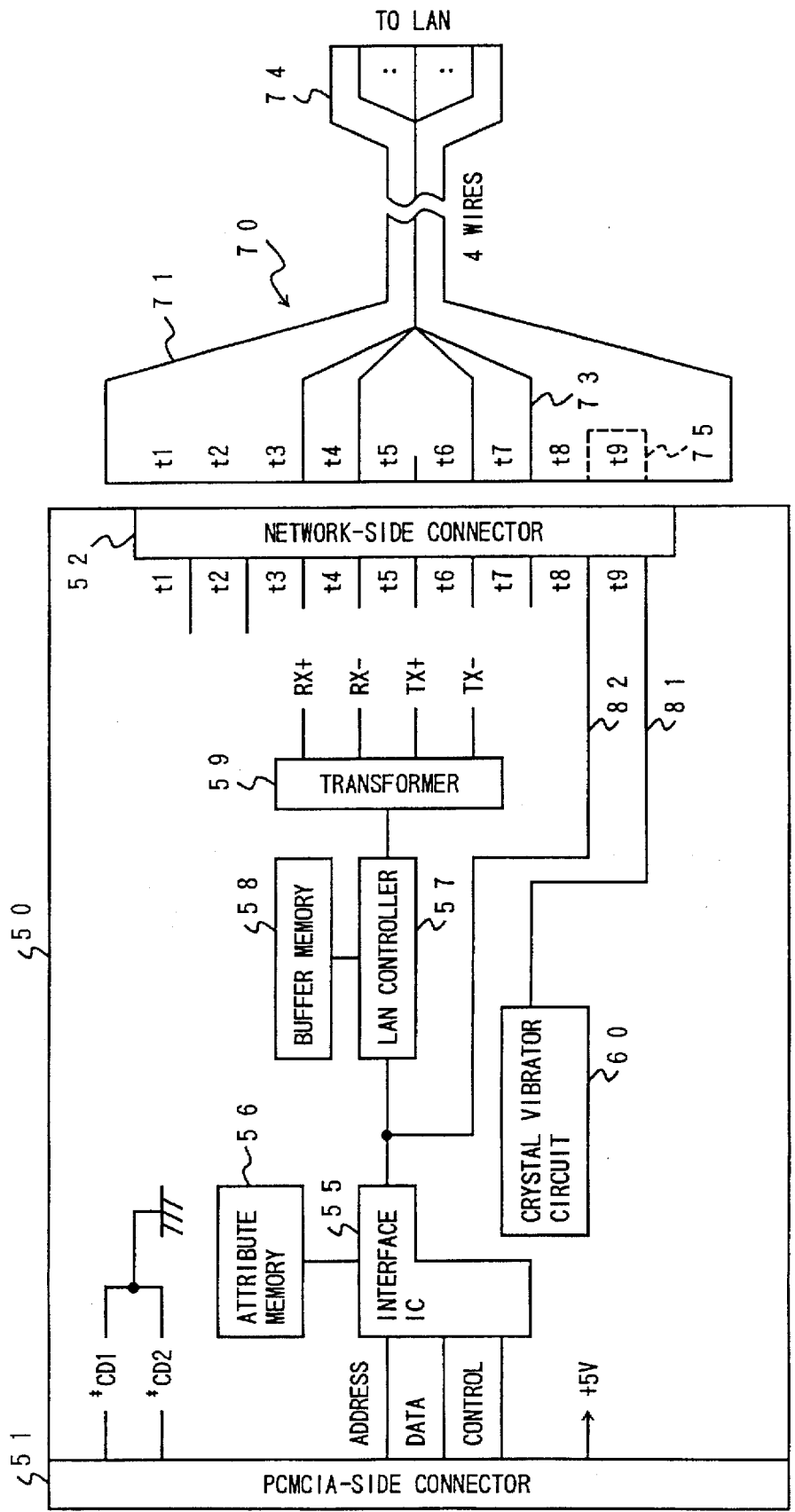
FIG. 5 is a block diagram of a second embodiment of the present invention.

A description will now be given, with reference to FIG. 5, of a second embodiment of the present invention.

In the first embodiment of the present invention, no electricity is supplied to the I/O card 50 in the loaded state until the connection cable 70 is attached to the I/O card 50. However, in the second embodiment of the present invention, electricity is supplied to the I/O card 50 when it is loaded to the personal computer 80 irrespective of whether the communications cable 70 is attached to the I/O card 50. That is, as shown in FIG. 5, the card loading detection signal lines carrying the detection signals *CD1 and *CD2 are grounded in the I/O card 50. As has been described previously, the power-down mode is conventionally used to save power consumed in the I/O card in the loaded state. For example, in the structure shown in FIG. 5, power to be supplied to the interface IC 55 and the LAN controller 57 is set to a minimum amount. However, the clock signal generated by the crystal vibrator circuit 60 is continuously supplied to the interface IC 55 and the LAN controller 57. Hence, these circuits continue to operate in synchronism with the clock signal and, therefore, consume some power.

The second embodiment of the present invention is configured taking into account the above. The clock signal by the crystal vibration circuit 60 is not supplied to the interface IC 55 and the LAN controller 57 until the I/O card 50 is loaded to the personal computer 80 and the communications cable 70 is attached to the I/O card 50. A clock signal supply line 81 extending from the crystal vibrator circuit 60 is connected to the terminal t9 of the network-side connector 52. A clock supply line 82 connected to the terminal t8 of the network-side connector 52 is connected to the interface IC 55 and the LAN controller 57. The terminals t8 and t9 of the external connector 71, which can engage the terminals t8 and t9 of the network-side connector 52, respectively, are connected together.

When the I/O card 50 is loaded to the personal computer 80 in the state where the external connector 71 is connected thereto, the signals *CD1 and *CD2 go to the ground level, and electricity is supplied to the I/O card 50 from the personal computer 80. When the power-down mode is set, for example, by the CPU 82 (FIG. 4) detecting a situation in which no signal is transferred via the I/O card 50 within a predetermined period, a minimum amount of electricity is supplied to the interface IC 55 and the LAN controller 57. In this state, when the external connector 71 is detached from the network-side connector 52 of the I/O card 50, the clock supply lines 81 and 82 are disconnected and supply of the clock signal is stopped. Hence, the interface IC 55 and the LAN controller 57 cannot operate in synchronism with the clock signal, and power consumed therein can be reduced to a minimum amount.

It will be noted that the clock signal is not supplied when the connection cable 70 is attached to the I/O card 50 irrespective of whether the power-down mode is selected. That is, even when a normal amount of power is supplied to the I/O card 50, power consumption can be reduced as long as the external connector 71 is in the detached state.

The present invention is not limited to the specifically disclosed embodiments, and variations and modifications may be made without departing from the scope of the present invention.

What is claimed is:

1. An I/O card insertable into an electronic device and supplied with electricity therefrom, said I/O card comprising:

a first connector for engaging a corresponding connector provided in the electronic device;

a second connector for engaging an external connector of an interconnection cable so as to connect the I/O card to an external device; and a circuit which notifies the electronic device that the I/O card has been inserted therein when the external connector is connected to the second connector of the I/O card inserted into the electronic device, the I/O card receiving a supply of electricity from the electronic device, said supply being started after the electronic device is notified by said circuit.

2. The I/O card as claimed in claim 1, wherein:

said second connector of the I/O card comprises a terminal for connecting to the electronic device via said first connector and for connecting to a signal line which detects the I/O card loaded into the electric device; and wherein said terminal is set to a given potential via said external connector.

3. The I/O card as claimed in claim 2, further comprising a communicating part providing data transfer between the electronic device and the external device.

4. The I/O card as claimed in claim 1, wherein:

said second connector of the I/O card comprises a first terminal for connecting to the electronic device via said first connector and for connecting to a signal line which detects the I/O card loaded into the electronic device, and a ground terminal; and said first terminal and said ground terminal are connected together via said external connector.

5. The I/O card as claimed in claim 4, further comprising a communicating part providing data transfer between the electronic device and the external device.

6. The I/O card as claimed in claim 1, further comprising a communicating part providing data transfer between the electronic device and the external device.

7. An interconnection cable connectable to an I/O card insertable into an electronic device and supplied with electricity therefrom, said interconnection cable comprising:

an external connector connectable to a connector of the I/O card; and a circuit part transmitting a detection signal from the I/O card to the electronic device, said detection signal indicating that the I/O card has been inserted into the electronic device when said external connector is connected to said connector of the I/O card inserted, the I/O card receiving a supply of electricity from the electronic device, said supply being started after the electronic device receives said detection signal.

8. A power saving method for an I/O card insertable into an electronic device and supplied with electricity therefrom, said power saving method comprising the steps of:

outputting a detection signal notifying the electronic device that the I/O card has been inserted therein when an external connector is connected to a connector of the I/O card; and providing a supply of electricity from the electronic device to the I/O card in response to receipt of said detection signal.

\* \* \* \* \*